(12) United States Patent
Goldenberg et al.

(10) Patent No.: US 8,701,267 B2
(45) Date of Patent: Apr. 22, 2014

(54) METHOD OF MAKING A FINGER SENSOR PACKAGE

(75) Inventors: Michael P. Goldenberg, Melbourne Beach, FL (US); Roger Schenk, Indialantic, FL (US); Phil Spletter, Satellite Beach, FL (US); Yang Rao, Rockledge, FL (US)

(73) Assignee: Authentec, Inc., Melbourne, FL (US)

( * ) Notice: Subject to any disclaimer, the term of this patent is extended or adjusted under 35 U.S.C. 154(b) by 637 days.

(21) Appl. No.: 12/940,555

(22) Filed: Nov. 5, 2010

(65) Prior Publication Data

US 2012/0112764 A1    May 10, 2012

(51) Int. Cl.
*H01S 4/00*    (2006.01)

(52) U.S. Cl.
USPC ............. 29/592.1; 29/594; 382/126; 324/629

(58) Field of Classification Search
USPC .......... 29/592.1, 830–832, 727, 739; 324/629, 324/348, 457; 382/116, 124–128, 312–315; 438/15, 51–55, 64
See application file for complete search history.

(56) References Cited

U.S. PATENT DOCUMENTS

| | | | |
|---|---|---|---|
| 4,941,255 A * | 7/1990 | Bull ............................... | 29/833 |
| 5,963,679 A | 10/1999 | Setlak ........................... | 382/312 |
| 6,015,722 A | 1/2000 | Banks et al. | |
| 6,259,804 B1 | 7/2001 | Setlak et al. .................. | 382/124 |
| 6,646,316 B2 | 11/2003 | Wu et al. ........................ | 257/434 |
| 6,950,541 B1 | 9/2005 | Setlak et al. .................. | 382/126 |
| 7,424,136 B2 * | 9/2008 | Setlak et al. .................. | 382/126 |
| 2003/0090007 A1 | 5/2003 | Fishbach et al. | |
| 2003/0224553 A1 | 12/2003 | Manansala | |
| 2005/0085033 A1 | 4/2005 | Magni et al. | |
| 2005/0089202 A1 | 4/2005 | Setlak et al. .................. | 382/124 |
| 2006/0170085 A1 | 8/2006 | Fukuta et al. | |
| 2007/0086630 A1 | 4/2007 | Setlak et al. .................. | 382/124 |
| 2007/0086634 A1 * | 4/2007 | Setlak et al. .................. | 382/128 |
| 2012/0112764 A1 * | 5/2012 | Goldenberg et al. ......... | 324/629 |

* cited by examiner

*Primary Examiner* — Minh Trinh

(74) *Attorney, Agent, or Firm* — Allen, Dyer, Doppelt, Milbrath & Gilchrist, P.A.

(57) ABSTRACT

A method of making finger sensor packages may include advancing a flexible circuit tape along a predetermined path of travel. The flexible circuit tape may include a flexible layer and conductive traces thereon defining individual flexible circuits. The method may include, as the flexible circuit tape is advanced along the path of travel, securing a respective finger sensing integrated circuit (IC) and surrounding sensor package frame to each flexible circuit, applying at least one fluid fill material adjacent each finger sensor IC while using the corresponding sensor package frame as a dam to thereby define finger sensor packages, and stamping out the finger sensor packages from the flexible circuit tape to form at least one flush common edge of each sensor package frame and individual flexible circuit.

20 Claims, 5 Drawing Sheets

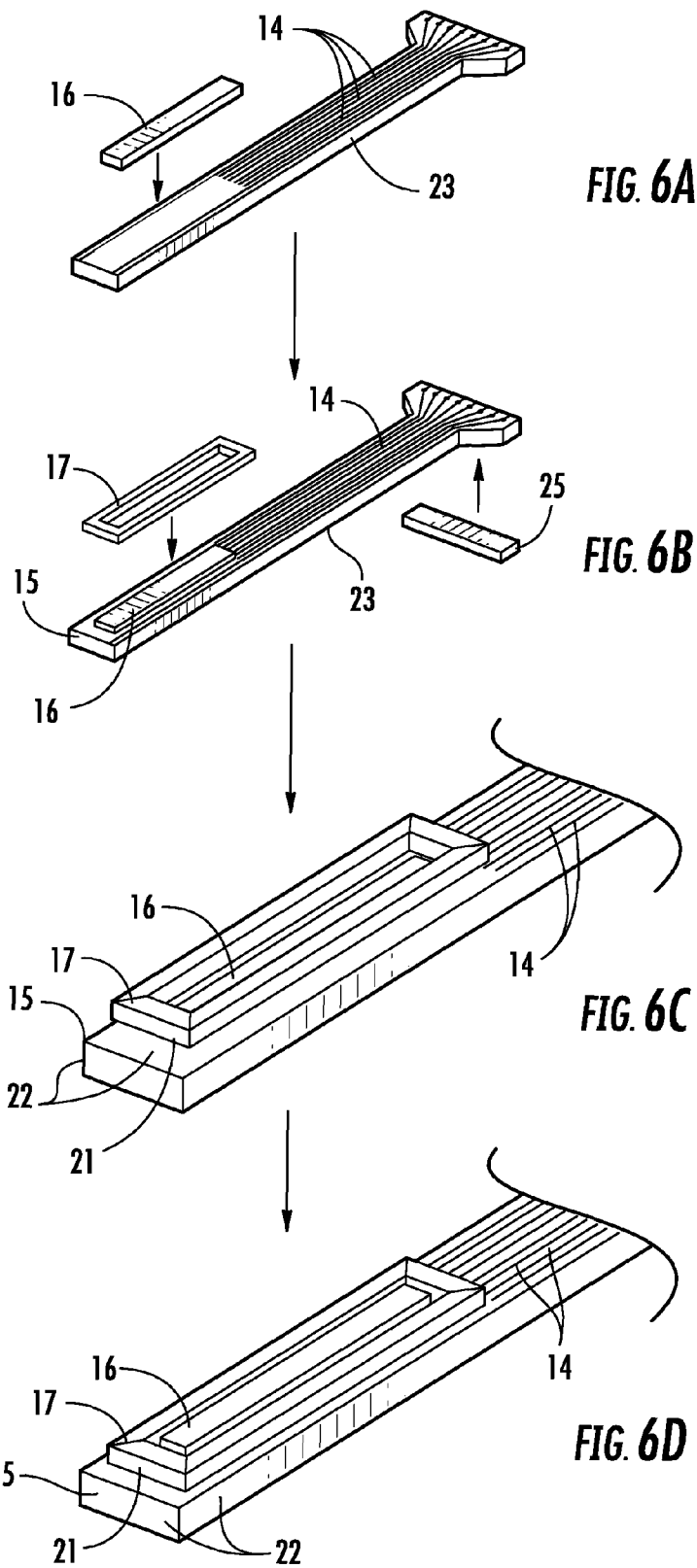

METHOD OF MAKING A FINGER SENSOR PACKAGE

FIELD OF THE INVENTION

The present invention relates to the field of electronics, and, more particularly, to finger sensors and related methods.

BACKGROUND OF THE INVENTION

Sensors including integrated circuits (ICs) that directly sense the physical properties of objects in the sensor's environment have come into widespread use in electronic equipment. These ICs are desirably in close proximity to the external environments they measure, but they should not be damaged by the mechanical and/or electrical events that an external environment can apply.

One type of such sensing is finger sensing and associated matching that have become a reliable and widely used technique for personal identification or verification. In particular, a common approach to fingerprint identification involves scanning a sample fingerprint or an image thereof and storing the image and/or unique characteristics of the fingerprint image. The characteristics of a sample fingerprint may be compared to information for reference fingerprints already in a database to determine proper identification of a person, such as for verification purposes.

A particularly advantageous approach to fingerprint sensing is disclosed in U.S. Pat. Nos. 5,963,679 and 6,259,804, assigned to the assignee of the present invention, the entire contents of which are incorporated herein by reference. The fingerprint sensor is an integrated circuit sensor that drives the user's finger with an electric field signal and senses the electric field with an array of electric field sensing pixels on the integrated circuit substrate. Additional finger sensing integrated circuits and methods are disclosed in U.S. Patent Application Publication No. 2005/0089202 entitled "Multi-biometric finger sensor including electric field sensing pixels and associated methods", also assigned to the assignee of the present invention, and the entire contents of which are incorporated herein by reference.

A number of prior art references disclose various types of packaging of IC sensors. For example, U.S. Pat. No. 6,646,316 to Wu et al. discloses an optical sensor including a sensing die with bond pads on an upper surface thereof. A flexible circuit board is coupled to the bond pads, and has an opening over the sensing surface.

U.S. Pat. No. 6,950,541, assigned to the assignee of the present application, discloses a fingerprint sensor package that includes a fingerprint sensing integrated circuit. The fingerprint sensor package is carried in a housing. The fingerprint sensor and the housing are carried by a flexible circuit substrate.

U.S. Patent Application Publication No. 2007/0086630, also assigned to the assignee of the present invention, discloses a finger sensor including a finger sensing integrated circuit carried by a flexible circuit. A frame surrounds the finger sensor.

Unfortunately, prior fabrication processes manually attached a separate protection housing or frame late in the assembly process that protects the fingerprint or finger sensing integrated circuit. In many instances, the protection housing or frame is manually attached after the finger sensing integrated circuit has been coupled to the flexible circuit and is removed for installation into a device. In other words, the protection housing is not included as part of the finger sensor and flexible circuit substrate coupling process, but rather coupled manually prior to completion of a final fingerprint sensor package.

As a result of manually attaching a separate protection housing late in the assembly process, variances due to tolerances of the assembly would occur. For example, the protection housing may be manually coupled to be misaligned with the finger sensing integrated circuit and more particularly, the flexible circuit substrate. This may result in an increased amount of fingerprint sensor packages being rejected for quality and/or a reduced overall fingerprint sensor package quality.

SUMMARY OF THE INVENTION

In view of the foregoing background, it is therefore an object of the present invention to provide a method for making a finger sensor package with reduced variances due to tolerances of the assembly and increased quality, and related devices.

This and other objects, features, and advantages in accordance with the present invention are provided by a method of making a finger sensor package that advantageously includes securing a sensor package frame as part of the assembly process to reduce variances due to tolerances of the assembly. The method may include advancing a flexible circuit tape along a predetermined path of travel. The flexible circuit tape may include a flexible layer and conductive traces thereon defining a plurality of individual flexible circuits, for example. The method may also include securing a respective finger sensing integrated circuit (IC) and surrounding sensor package frame to each individual flexible circuit as the flexible circuit tape is advanced along the path of travel.

The method may also include applying at least one fluid fill material adjacent each finger sensor IC while using the corresponding sensor package frame as a dam to thereby define a plurality of finger sensor packages as the flexible circuit tape is advanced along the path of travel. The method may further include stamping out the plurality of finger sensor packages from the flexible circuit tape to form at least one flush common edge of each sensor package frame and individual flexible circuit, as the flexible circuit tape is advanced along the path of travel, for example. Advantageously, the method provides a finger sensor package having reduced variances due to tolerances of the assembly.

Each individual flexible circuit may include an extension portion extending outwardly from the corresponding sensor package frame. The method may further include securing a respective stiffener member on a distal end of the extension portion of the corresponding individual flexible circuit. The respective stiffener member on the distal end may advantageously improve ease of connection of the extension portion to a respective connector.

The at least one flush common edge may include three flush common edges, for example. The three flush edges may be formed from trimming the three edges of each individual flexible circuit adjacent the finger sensing IC and opposite the extension portion. Having at least one flush common edge may advantageously reduce variances due to tolerances of the assembly.

The at least one fluid fill material may include at least one curable fluid fill material, for example. The method may include curing the at least one curable fluid fill material prior to stamping. The at least one fluid fill material may include an underfill fluid material applied between the individual flexible circuit and adjacent portions of each finger sensing IC. The at least one fluid fill material may also include a backfill fluid material applied between each sensor package frame and adjacent portions of the corresponding finger sensing IC, for example.

Securing the respective sensor package frame may include securing using an adhesive, for example. Each finger sensing IC may include a plurality of finger sensing pixels opposing adjacent portions of the corresponding individual flexible circuit. Each sensor package frame may have a rectangular shape, for example, and each finger sensing IC may include a plurality of bond pads connected to corresponding ones of the plurality of conductive traces.

Indeed, while a finger sensor package may advantageously be made from a flexible circuit tape in accordance with the method described above, the method is similarly advantageous for making a finger sensor package on an individual, or non-tape, flexible substrate, as will be appreciated by those skilled in the art.

A device aspect is directed to a finger sensor package that may include a finger sensing IC. The finger sensor package may also include a flexible circuit secured to the finger sensing IC, for example. The flexible circuit may include a flexible layer and a plurality of conductive traces thereon. The finger sensor package may also include a sensor package frame secured to the flexible circuit and surrounding the finger sensing IC and at least one fill material adjacent the finger sensing IC. At least one edge of the flexible circuit and the sensor package frame have at least one flush common edge therebetween, for example.

BRIEF DESCRIPTION OF THE DRAWINGS

FIGS. 6a-6d are perspective views of a flexible circuit during making of a finger sensor package in accordance with the present invention.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
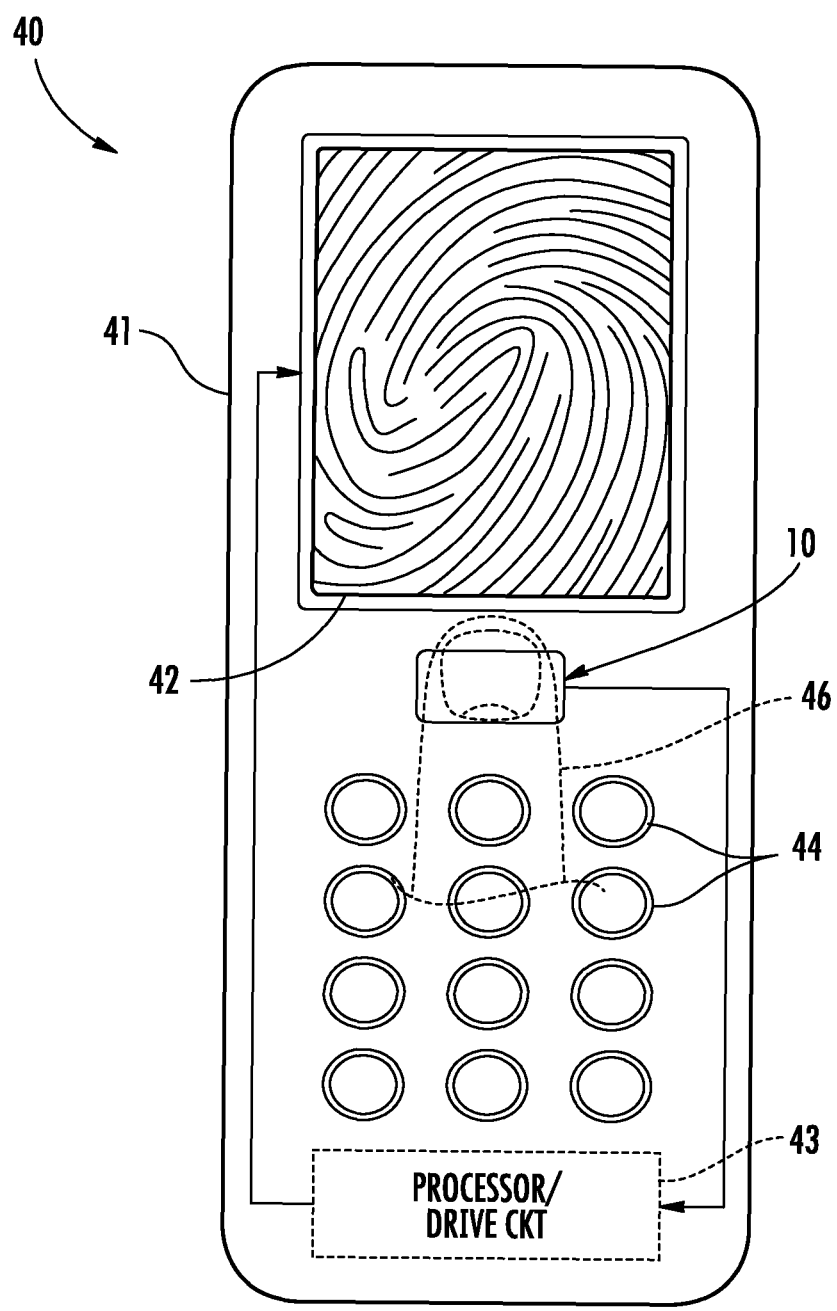
FIG. 1 is a schematic plan view of a cellular telephone including a finger sensor package in accordance with the present invention.
Figure 2:
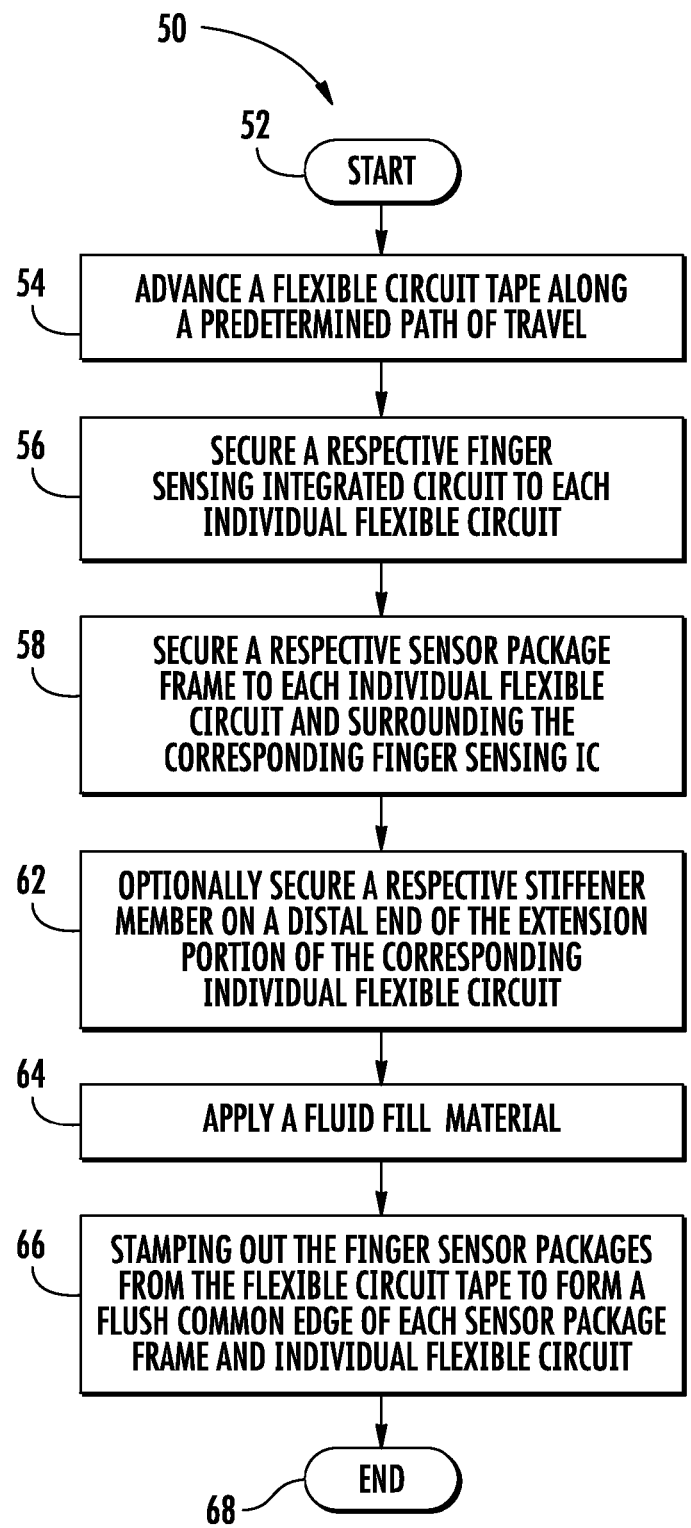
FIG. 2 is a flowchart for a method of making a finger sensor package in accordance with the present invention.

Referring initially to FIG. 1, embodiments of a finger sensor package 10 in accordance with the invention are now described. The finger sensor package 10 is illustratively mounted on an exposed surface of a candy bar-type cellular telephone 40. The illustrated candy bar-type cellular telephone 40 is relatively compact and does not include a flip cover or other arrangement to protect the finger sensor package 10 as may be done in other types of cellular phones. Of course, the finger sensor package 10 can also be used with these other more protective types of cell phones as will be appreciated by those skilled in the art. The finger sensor package 10 can also be used with other portable and stationary electronic devices as well. The increased durability and ruggedness of the finger sensor package 10 will permit its widespread use even when exposed.

The cellular telephone 40 includes a housing 41, a display 42 carried by the housing, and processor/drive circuitry 43 also carried by the housing and connected to the display and to the finger sensor package 10. An array of input keys 44 are also illustratively provided and used for conventional cellphone dialing and other applications as will be appreciated by those skilled in the art.

The finger sensor package 10 may be of the slide type where the user's finger 46 slides over the sensing area to generate a sequence of finger images. Alternatively, the finger sensor package 10 could be of the static placement type, where the user simply places his finger onto the sensing surface to generate a finger image. Of course, the finger sensor 10 package may also include circuitry embedded therein and/or in cooperation with the processor/drive circuit 43 to provide menu navigation and selection functions as will be appreciated by those skilled in the art.

Figure 3:
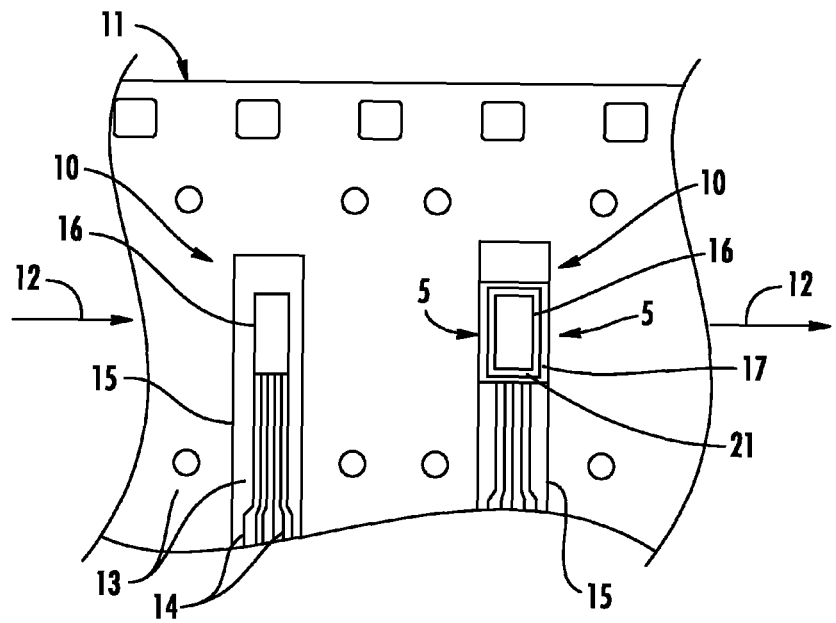
FIG. 3 is a top plan view of a portion of a flexible circuit tape during making of the finger sensor package in accordance with the present invention.
Figure 4:
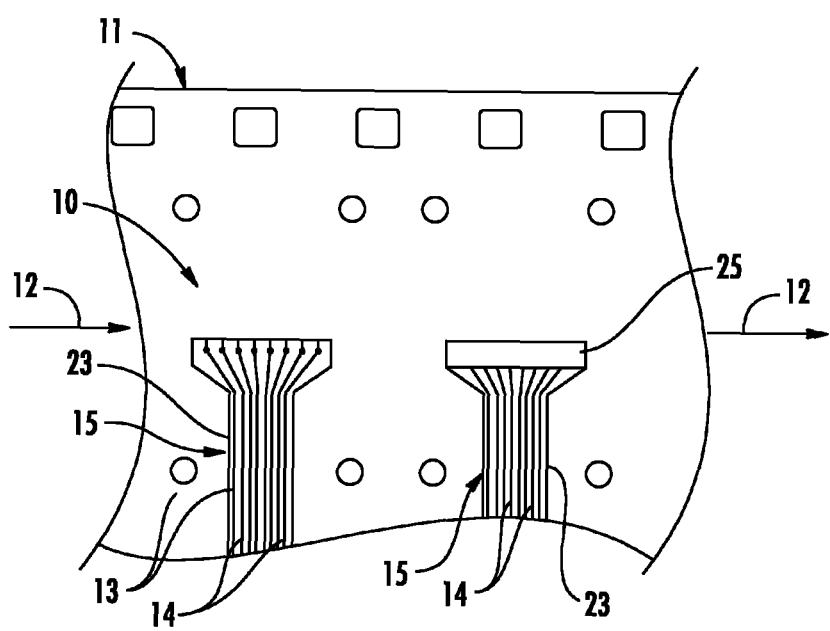
FIG. 4 is a bottom plan view of a portion of a flexible circuit tape during making of the finger sensor package in accordance with the present invention.

Referring now more particularly to the flowchart 50 of FIG. 2 and FIGS. 3-5, a method of making a finger sensor package 10 begins at Block 52. The method illustratively includes at Block 54, advancing a flexible circuit tape 11 along a predetermined path of travel 12. For example, the flexible circuit tape 11 may be advanced along a production line in a tape and reel configuration (FIGS. 3-4). The flexible circuit tape 11 includes a flexible layer 13 and conductive traces 14 thereon defining a plurality of individual flexible circuits 15.

Of course, the flexible layer 13 preferably includes a material or combination of materials to permit finger sensing therethrough. Kapton is one such suitable material, although those of skill in the art will readily recognize other suitable materials. Kapton is also hydrophobic providing an advantage that it may permit reading of partially wet or sweating fingers more readily, as any moisture may tend to resist smearing across the image as will be appreciated by those skilled in the art.

Figure 5:
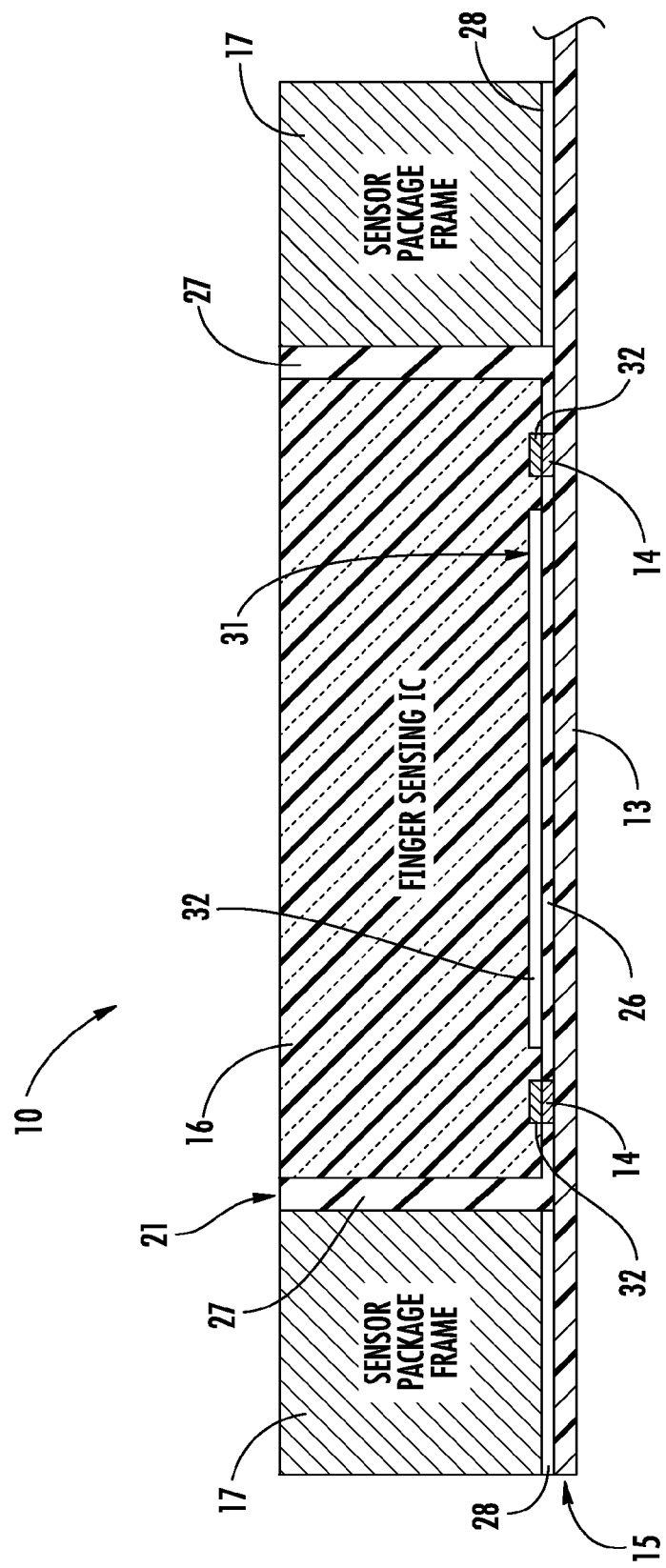
FIG. 5 is a cross-sectional view of a portion of the finger sensor package taken along 5-5 of FIG. 3.

The method includes, at Block 56, securing a respective finger sensing integrated circuit (IC) 16 to each individual flexible circuit 15, as the flexible circuit tape 11 is advanced along the path of travel 12. The finger sensing IC 16 includes a finger sensing area 31 and a plurality of bond pads 32 adjacent thereto (FIG. 5). In particular, the finger sensing IC 16 may include a semiconductor substrate having an upper surface, and the finger sensing area 31 may include an array of sensing electrodes 33 carried by the upper surface of the semiconductor substrate, such as for electric field finger sensing, for example. Capacitive and/or thermal sensing pixels may also be used, for example, and may oppose adjacent portions of each individual flexible circuit 15.

Securing the finger sensing IC 16 to the flexible circuit 15 may include covering both the finger sensing area 31 and the bond pads 32 of the IC finger sensor. The conductive traces 14 of the flexible circuit 15 may be coupled to the bond pads 32. Each finger sensing IC 16 may be secured to each individual flexible circuit by soldering, for example. Other securing methods may be used, as will be appreciated by those skilled in the art. Additional details of the finger sensing IC and the flexible substrate are described in U.S. Patent Application Publication No. 2007/0086630, assigned to the assignee of the present application, and the entire contents of which are herein incorporated by reference.

The method also illustratively includes securing a respective sensor package frame 17 to each individual flexible circuit 15 and surrounding the corresponding finger sensing IC 16 (Block 58). Each sensor package frame 17 may be secured to the corresponding flexible circuit 15 using an adhesive, for example, a pressure sensitive adhesive 28. Other or additional adhesive or securing methods, for example an epoxy paste, may be used, as will be appreciated by those skilled in the art.

Each sensor package frame 17 illustratively is rectangular in shape and has a rectangular opening 24 defined therein. Each sensor package frame and its respective opening may be other shapes, for example circular, as will be appreciated by those skilled in the art. Each sensor package frame 17 may be aluminum or other material, as will be appreciated by those skilled in the art.

Additionally, each sensor package frame 17 and respective finger sensing IC 16 may be flush in height from each individual flexible circuit 15 (FIG. 5). The package sensor frame 17 advantageously mechanically protects the finger sensing IC 16 during a tape reel process, or as it is advanced along the predetermined path of travel 12, and thus provides reduced manufacturing costs.

Each individual flexible circuit 15 includes an extension portion 23 extending outwardly from the corresponding sensor package frame. At Block 62, the method may include optionally securing a respective stiffener member 25 on a distal end of the extension portion 23 of the corresponding individual flexible circuit 15 (FIG. 4). The respective stiffener member 25 may be secured using a pressure sensitive adhesive 28, for example, and is illustratively applied to a bottom of the flexible circuit tape 11. Other adhesives may be used, and the respective stiffener member 25 may be secured to a top of the flexible circuit tape 11. In some embodiments (not shown), the extension portion 23 may include a connector, for example, and the respective stiffener member 25 advantageously may increase ease of coupling the connector, and thus ease installation of the finger sensor package 10.

At Block 64 a fluid fill material 21 is applied as the flexible circuit tape 11 is advanced along the path of travel 12. The fluid fill material 21 is illustratively adjacent each finger sensor IC 16 while using the corresponding sensor package frame 17 as a dam to thereby define the finger sensor packages 10. For example, the fluid fill material 21 illustratively includes a curable fluid fill material. More particularly, the fluid fill material 21 includes an underfill fluid material 26 applied between the individual flexible circuit 15 and adjacent portions of each finger sensing IC 16, and a backfill fluid material 27 applied between each sensor package frame 17 and adjacent portions of the corresponding finger sensing IC (FIG. 5). Other or additional fluid fill materials may be used, as will be appreciated by those skilled in the art.

Where the fluid fill material 21 includes at least one curable fluid fill material, the method may optionally include curing the curable fluid fill material prior to stamping. Exposure to air or to ultra-violet light may cure the fill material 21, for example. In some embodiments, more than one fluid fill material may be included.

At Block 66, the method illustratively includes, as the flexible circuit tape 11 is advanced along the path of travel 12, stamping out the finger sensor packages 10 from the flexible circuit tape 11 to form a flush common edge 22 of each sensor package frame 17 and individual flexible circuit 15. In some embodiments, the finger sensor packages 10 may be stamped out of the flexible circuit tape 11 to form three flush common edges 22. For example, the three flush edges 22 may be three edges of the flexible circuit 15 that do not extend outwardly or are not included in the extension portion 23. The method ends at Block 68.

The method of making a plurality of finger sensor packages 10 advantageously reduces the costs and increase ease of building a finger sensor package as compared with using a separate finger sensor package frame that is added after the finger sensor package is stamped, or after it has been removed from the flexible circuit tape. More particularly, manually attaching a finger sensor package frame late in the assembly process, for example, after the finger sensor package has been removed from the flexible circuit tape, may lead to variances due to tolerances of the assembly, and provides no common product edge perimeter.

Indeed, the method described herein advantageously creates a common product edge perimeter, and thus reduces the variances due to the tolerances of the assembly and assembly costs. Additionally, while a finger sensor package 10 may advantageously be made from a flexible circuit tape 11, as described above, the method described above is similarly advantageous for making a finger sensor package on an individual, or non-tape, flexible circuit, as will be appreciated by those skilled in the art. Still further, the method described herein, because of the flush cut edges, may advantageously prevent the flexible circuit 15 from peeling along the edges thereof.

Referring now additionally to FIGS. 6a-6d, the above method may be applied to the individual flexible circuits 15, as will be appreciated by those skilled in the art. The method includes securing the finger sensing IC 16 to each individual flexible circuit 15 (FIG. 6a). The method also includes securing the sensor package frame 17 to the flexible circuit 15 and surrounding the finger sensing IC 16 (FIG. 6b). Illustratively, each individual flexible circuit 15 includes an extension portion 23 extending outwardly from the corresponding sensor package frame. The method may also include optionally securing a respective stiffener member 25 on a distal end of the extension portion 23 of the flexible circuit 15 (FIG. 6b).

The method also includes applying the fluid fill material 21 adjacent the finger sensor IC 16 while using the sensor package frame 17 as a dam (FIG. 6c). Illustratively, the flexible circuit 15 is larger in area and has an edge extending beyond edges of the sensor package frame 17. As will be appreciated by those skilled in the art, more than one edge of the flexible circuit 15 may extend beyond corresponding edges of the sensor package frame 17, and/or the sensor package frame may extend beyond the edges of the flexible circuit 16 (FIG. 6c).

The method also includes trimming at least one edge 22 of the flexible circuit 15 to make the finger sensor package have at least one flush common edge 22 between the sensor package frame 17 and flexible circuit 15 (FIG. 6d).

A device aspect is directed to a finger sensor package 10. Illustratively, the finger sensor package 10 includes a finger sensing integrated circuit (IC) 16 and a flexible circuit 15 secured to the finger sensing IC. The flexible circuit 15 includes a flexible layer 13 and a plurality of conductive traces 14 thereon. The finger sensor package 10 also includes a sensor package frame 17 secured to the flexible circuit 15 and surrounding the finger sensing IC 16. A fill material is adjacent the finger sensing IC 16 and is dammed by the package frame 17. Three edges 22 of the flexible circuit 15 and the sensor package frame 17 have at least one flush common edge therebetween. Of course, any number of edges may be flush.

Many modifications and other embodiments of the invention will come to the mind of one skilled in the art having the That which is claimed is:

1. A method of making a plurality of finger sensor packages comprising:
    advancing a flexible circuit tape along a predetermined path of travel, the flexible circuit tape comprising a flexible layer and conductive traces thereon defining a plurality of individual flexible circuits; and
    performing the following steps as the flexible circuit tape is advanced along the path of travel
        securing a respective finger sensing integrated circuit (IC) and surrounding sensor package frame to each individual flexible circuit,
        applying at least one fluid fill material adjacent each finger sensor IC while using the corresponding sensor package frame as a dam to thereby define a plurality of finger sensor packages, and
        stamping out the plurality of finger sensor packages from the flexible circuit tape to form at least one flush common edge of each sensor package frame and individual flexible circuit.

2. The method according to claim 1 wherein each individual flexible circuit comprises an extension portion extending outwardly from the corresponding sensor package frame.

3. The method according to claim 2 wherein performing the following steps further comprises securing a respective stiffener member on a distal end of the extension portion of the corresponding individual flexible circuit.

4. The method according to claim 1 wherein the at least one flush common edge comprises three flush common edges.

5. The method according to claim 1 wherein the at least one fluid fill material comprises at least one curable fluid fill material; and further comprising curing the at least one curable fluid fill material prior to stamping.

6. The method according to claim 1 wherein the at least one fluid fill material comprises:
    an underfill fluid material applied between the individual flexible circuit and adjacent portions of each finger sensing IC; and
    a backfill fluid material applied between each sensor package frame and adjacent portions of the corresponding finger sensing IC.

7. The method according to claim 1 wherein securing the sensor package frame comprises securing using an adhesive.

8. The method according to claim 1 wherein each finger sensing IC comprises a plurality of finger sensing pixels opposing adjacent portions of the corresponding individual flexible circuit.

9. The method according to claim 1 wherein each sensor package frame has a rectangular shape.

10. The method according to claim 1 wherein each finger sensing IC comprises a plurality of bond pads connected to corresponding ones of the plurality of conductive traces.

11. A method of making a finger sensor package comprising:
    securing a finger sensing integrated circuit (IC) to a flexible circuit, the flexible circuit comprising a flexible layer and a plurality of conductive traces thereon;
    securing a sensor package frame to the flexible circuit and surrounding the finger sensing IC;
    applying at least one fluid fill material adjacent the finger sensor IC while using the sensor package frame as a dam; and
    trimming at least one edge of the flexible circuit and sensor package frame to make the finger sensor package having at least one flush common edge between the sensor package frame and flexible circuit.

12. The method according to claim 11 wherein the flexible circuit comprises an extension portion extending outwardly from the sensor package frame.

13. The method according to claim 12 further comprising securing a respective stiffener member on a distal end of the extension portion of the flexible circuit.

14. The method according to claim 11 wherein the at least one flush common edge comprises three flush common edges.

15. The method according to claim 11 wherein the at least one fluid fill material comprises at least one curable fluid fill material; and further comprising curing the at least one curable fluid fill material prior to trimming.

16. The method according to claim 11 wherein the at least one fluid fill material comprises:
    an underfill fluid material applied between the flexible circuit and adjacent portions of the finger sensing IC; and
    a backfill fluid material applied between the sensor package frame and adjacent portions of the finger sensing IC.

17. The method according to claim 11 wherein securing the sensor package frame comprises securing using an adhesive.

18. The method according to claim 11 wherein the finger sensing IC comprises a plurality of finger sensing pixels opposing adjacent portions of the flexible circuit.

19. The method according to claim 11 wherein the sensor package frame has a rectangular shape.

20. The method according to claim 11 wherein the finger sensing IC comprises a plurality of bond pads connected to corresponding ones of the plurality of conductive traces.

* * * * *